United States Patent
Freeman et al.

(10) Patent No.: US 7,105,220 B2
(45) Date of Patent: Sep. 12, 2006

(54) COATED ARTICLE HAVING A SEALED LAYERED EDGE TO IMPEDE CORROSION OF A COATING AT THE EDGE AND METHOD OF MAKING SAME

(75) Inventors: Glenn E. Freeman, Tarentum, PA (US); Robert C. Lewetag, Saxonburg, PA (US); James P. Thiel, Pittsburgh, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 373 days.

(21) Appl. No.: 10/353,566

(22) Filed: Jan. 29, 2003

(65) Prior Publication Data
US 2004/0146645 A1   Jul. 29, 2004

(51) Int. Cl.
  *B32B 3/00*   (2006.01)
  *B32B 23/02*   (2006.01)
  *E06B 3/24*   (2006.01)
  *E04C 2/54*   (2006.01)

(52) U.S. Cl. ............... 428/172; 428/34; 428/77; 428/201; 428/209; 428/210; 52/786.13

(58) Field of Classification Search ........... 428/34, 428/77, 167, 172, 192, 201, 209; 52/786.13; 219/203
See application file for complete search history.

(56) References Cited

U.S. PATENT DOCUMENTS

| | | | |
|---|---|---|---|
| 4,587,769 A | 5/1986 | Cathers | 51/165.87 |
| 4,902,580 A | 2/1990 | Gillery | 428/623 |
| 5,030,592 A | 7/1991 | Komarneni et al. | 501/9 |
| 5,110,669 A * | 5/1992 | Knobel et al. | 428/215 |
| 5,162,145 A * | 11/1992 | Schaefer | 428/209 |
| 5,240,886 A | 8/1993 | Gulotta et al. | 501/70 |
| 5,464,657 A | 11/1995 | Athey et al. | 427/255.5 |
| 5,492,750 A | 2/1996 | Shumaker, Jr. et al. | 428/192 |
| 5,593,929 A | 1/1997 | Krumwiede et al. | 501/70 |
| 5,738,947 A | 4/1998 | Hijikata et al. | 428/629 |
| 5,761,946 A | 6/1998 | Misera et al. | 72/181 |
| 5,775,393 A | 7/1998 | Kovacik | 141/383 |

FOREIGN PATENT DOCUMENTS

| | | |
|---|---|---|
| GB | 405850 | 2/1934 |
| GB | 2311540 | 10/1997 |
| WO | WO00/29346 | * 5/2000 |
| WO | 00/76930 | 12/2000 |

OTHER PUBLICATIONS

U.S. Appl. No. 08/082,120, filed Jun. 23, 1993.
U.S. Appl. No. 10/201,863, filed Jul. 24, 2002.
EP Application No. 00939609.4, now WO 00/76930 (enclosed).
International Search Report mailed Sep. 6, 2004.

* cited by examiner

Primary Examiner—Donald J. Loney
(74) Attorney, Agent, or Firm—Andrew C. Siminerio

(57) ABSTRACT

An article having a sealed layered edge, e.g. an automotive laminate and a multiple glazed unit includes a pair of glass sheet in a fixed relationship with one another. A sputtered coating is deposited on a major surface of one of the sheets and includes at least one combination of a metal film, e.g. a silver film and a dielectric film. Discontinuities in the metal film at the marginal edges of the coated sheet provide voids in the metal film to impede or stop corrosion of the metal film. The discontinuities include (1) break lines or segments in the coating, (2) coating thickness variations provided by abrading the coating and (3) spaced discrete coating areas on the marginal edges of the coated sheet. The discontinuities may be made in the metal film using a laser, an abrasive surface, a coating mask and/or coating deletion techniques.

32 Claims, 3 Drawing Sheets

COATED ARTICLE HAVING A SEALED LAYERED EDGE TO IMPEDE CORROSION OF A COATING AT THE EDGE AND METHOD OF MAKING SAME

BACKGROUND OF THE INVENTION

1. Field of the Invention

This invention relates to an article, e.g. a laminated transparency, and/or a multiple glazed unit, having a sealed layered edge to impede corrosion of a coating at the sealed edge of the article and to a method of making the article, and more particularly, to a laminated transparency and/or multiple glazed unit having a coating containing a metal film, e.g. a sputtered solar control coating and/or heatable coating, and having discontinuities in the metal film at the sealed layered edge to impede corrosion of the metal film at least in a direction inward away from the edge, and to method of making the laminated transparency and/or multiple glazed unit.

2. Discussion of the Technical Issues

Sputtered solar control and/or heatable coatings are applied to substrates, e.g. glass sheets, and the coated substrates are used in the manufacture of articles, e.g. transparencies such as laminated automotive windshields; multiple glazed units or windows for homes, commercial buildings, and windows for storage cases, e.g. windows for refrigerator doors. A common feature of the transparencies is that the transparencies have sealed layered edges. Another common feature of the transparencies is that the coatings usually include one or more sets of a metal film, e.g. a silver film and a dielectric film. Examples of such coatings are discussed in European Patent Application No. 00939609.4. Sputtered coatings are soft coating, compared to pyrolytic coatings, similar to the type disclosed in U.S. Pat. No. 5,464,657, and are usually applied to the surface of the glass sheet designated as an inner surface of the laminate or multiple glazed window.

The usual practice in the manufacture of a laminate is to provide a plastic sheet between a pair of glass sheets with the coating facing one of the surfaces of the plastic sheet and to apply heat and pressure to the glass and plastic sheets to form the laminate. The usual practice in the manufacture of a multiple glazed unit is to position a spacer frame having a layer of moisture impervious adhesive on opposed surfaces of the spacer frame between a pair of glass sheets with a coating facing the spacer frame. The glass sheets are biased toward one another against the spacer frame to flow the adhesive to seal the edges of the unit.

The coating on the marginal edge portions of the sheet in each instance is between the glass sheet and a plastic layer, e.g. the plastic sheet or the layer of moisture impervious adhesive. Moisture in the atmosphere often containing corrosive materials, e.g. acid, attacks the edge of the coating exposed at the periphery of the article, and in particular the edge of the metal film of the coating, and corrodes the metal film. The corrosion of the coating or metal film continues into the sealed layered edge of the article. Minor corrosion of the coating at the sealed marginal edges is unsightly, whereas sever corrosion of the coating at the sealed marginal edges may result in failure of the sealed edge. In the case of a laminate, the failure of the sealed edge may result in delamination of the laminate, and in the case of a multiple glazed unit, the failure of the sealed edge results in air moving into the unit.

The present practice to eliminate corrosion of the coating or metal film of the coating at the sealed layered edges is to provide a coated sheet having uncoated marginal edges. One technique to provide uncoated marginal edges is to mask the marginal edges of the sheet during the coating operation, e.g. as taught in U.S. Pat. No. 5,492,750. Another technique is to coat the complete surface of the sheet and, thereafter, completely remove the coating from the marginal edge portions of the sheet, e.g. as taught in U.S. Pat. No. 4,587,769.

The present techniques are acceptable to prevent corrosion of the coating at the sealed layered edges; however, it would be beneficial to have less expensive techniques available to impede the corrosion of the metal film of the coating at the sealed layered edge of an article.

SUMMARY OF THE INVENTION

The invention relates to an article having a sealed layered edge including first and second substrates, e.g. glass sheets each having a major surface with a coating on at least the marginal edges of the major surface of the first sheet, the coating at the marginal edges of the major surface having discontinuities. An edge assembly secures the first substrate in a fixed relationship to the second substrate with the major surfaces of the sheets facing one another to provide an article having a sealed layered edge. The coating applied to the major surface of the first sheet includes at least one metal film, e.g. a silver film having discontinuities to impede corrosion of the metal at least inward toward the center of the substrates. The terms "discontinuity", "discontinuities", "area of discontinuity" or "areas of discontinuity" as used herein means one or more impressions made in a coating to impede corrosion of the coating. In a non-limiting embodiment of the invention the coating includes or is a metal film, e.g. a silver film, having an area of discontinuity formed by removing portions of the metal film to reduce the thickness of the metal film. The impressions can be partial removal of the metal film to reduce its thickness and/or one or more voids in, or holes through, the metal film. As will be appreciated, it is preferred, although not limiting to the invention that the "discontinuity", "discontinuities", "area of discontinuity" or "areas of discontinuity" be holes or voids in the metal film. In the instance where a depression or a groove extending along a path is the "discontinuity", "discontinuities", "area of discontinuity" or "areas of discontinuity", all or portions of the line or the groove can extend through the metal film. The invention is not limited to the manner in which a coating having a metal film is applied to a surface. More particularly and not limiting to the invention, the coating and/or metal film can be applied as a sputtered coating, e.g. as disclosed in European Patent Application No. 00939609.4, can be applied as a pyrolytic coating, e.g. as disclosed in U.S. Pat. No. 5,464,657, can be painted on a surface, e.g. sprayed or brushed and/or can be applied as a film.

In a non-limiting embodiment of the invention, the areas of discontinuity in the metal film of the coating includes at least one groove extending along a path spaced from the edge of the first sheet. Non-limiting embodiments of grooves include, but not limiting the invention thereto:

(1) one or more grooves of endless length, e.g. circles in and/or through the metal film and spaced from the edge of the sheet and one another;
 (2) a groove of continuous length having a starting point in and/or through the metal film at the marginal edge of the sheet and extending away from the starting point along a path spaced from and following the peripheral edge of the first sheet and ending a cycle defined as the first cycle at an end point aligned with the starting point of the first cycle and spaced a greater distance from the peripheral edge of the first sheet than the distance of the starting point of the first cycle from the peripheral edge of the first sheet and starting a second cycle at the end point of the first cycle sheet, the groove of continuous length has a length greater than the length of the first cycle. In another non-limiting embodiment, the length of the continuous groove in the second cycle extends along a path away from the end point of the first cycle, spaced from the groove of the first cycle and following the peripheral edge of the first sheet and ending the second cycle at an end point aligned with the starting point of the second cycle and spaced a greater distance from the peripheral edge of the first sheet than the distance of the starting point of the second cycle from the peripheral edge of the first sheet and starting a third cycle at the end point of the second cycle, wherein the groove of continuous length has a length greater than the length of the groove of the second cycle;

(3) a plurality of discrete groove segments in and/or through the metal film along a path spaced from the peripheral edge of the first sheet defined as a first path with a space between ends of adjacent groove segments and at least a second plurality of discrete groove segments in and/or through the metal film along a second path, the second path spaced from the first path and a greater distance from the peripheral edge of the first sheet than the first path with a space between ends of adjacent groove segments along the second path and the groove segments along the first path aligned with the space between adjacent groove segments along the second path. In one non-limiting embodiment of the invention, a plurality of discrete groove segments are along a third path spaced from the second path and spaced a greater distance from the edge of the first sheet than the second path with the end of the groove segments along the third path spaced from one another and aligned with the groove segments of first and second paths; and/or (4) a plurality of spaced grooves in and/or through the metal film extending along a path having its staring point adjacent the peripheral edge of the sheet and extending away from the peripheral edge of the sheet toward the center of the sheet.

In another non-limiting embodiment of the invention, the areas of discontinuity include a plurality of spaced discrete coating areas on the marginal edge portions of the first sheet, with the space between the coating areas being the major surface portions of the first sheet. In one non-limiting embodiment, the coating areas increase as the distance from the edge of the first sheet increases.

In a still further non-limiting embodiment of the invention, areas of discontinuity are various thicknesses of the metal film to provide the metal film with peaks and valleys extending into and/or through the metal film. The peaks and valleys can be applied by moving an abrasive surface over the coating to remove portions of the coating and underlying metal film.

As can be appreciated the invention is not limited to the distance from the edge of the coated glass that the area of discontinuity is applied to the coating. More particularly, automotive transparencies, e.g. windshields, can have a black ceramic band around the marginal edge to protect the underlying adhesive from solar deterioration and the edges of multiple glazed units are mounted in window sashes. The invention prevents or impedes corrosion at least away from the edge of the glass; therefore, for aesthetic purposes, the area of discontinuity can be applied at any distance from the edge under the ceramic band for automotive windshields and any distance from the edge of multiple glazed units that is mounted in the sash. In non-limiting embodiments of the invention, the area of discontinuity in the metal film(s) is within a distance of 3 millimeters (mm) from the edge of the first sheet, for example 6 mm or 8 mm.

The area of discontinuity can be made in any usual manner, e.g. a laser, an article having an abrasive surface or mask to selectively delete portions of the metal film adjacent the marginal edges of the sheet. In other non-limiting embodiments of the invention, when the coating has two or more metal films, the areas of discontinuity can extend through portions of the metal film(s) farthest from the glass sheet and into portions of the metal film closest to the glass sheet at the marginal edges of the first sheet. In one non-limiting embodiment, the areas of discontinuity extend through portions of all the metal films of the coating at the marginal edges of the first sheet.

Another non-limiting embodiment of the invention relates to a method of preventing corrosion of a coating at sealed layered edge of an article and includes the steps of applying a coating over the major surface of the first substrate, the coating being subject to corrosion in an environment in which the article is to be used. An area of discontinuity is applied to the coating at the marginal edge portions of the first substrate, and the coating at the marginal edge portions of the first substrate is secured to the marginal edge portions of the second substrate to provide an article having a sealed layered edge. Thereafter, the coated article is exposed to the environment in which the coating is subject to corrosion.

A further non-limiting embodiment of the invention relates to a method of making an article having a sealed layered edge and having the areas of discontinuity in the metal film at the marginal edges.

Still further, the invention contemplates at least one of the outer surfaces of the article having a hydrophobic coating and/or a photocatalytic coating.

BRIEF DISCRIPTION OF THE DRAWINGS

DETAILED DESCRIPTION OF THE INVENTION

Figure 1:
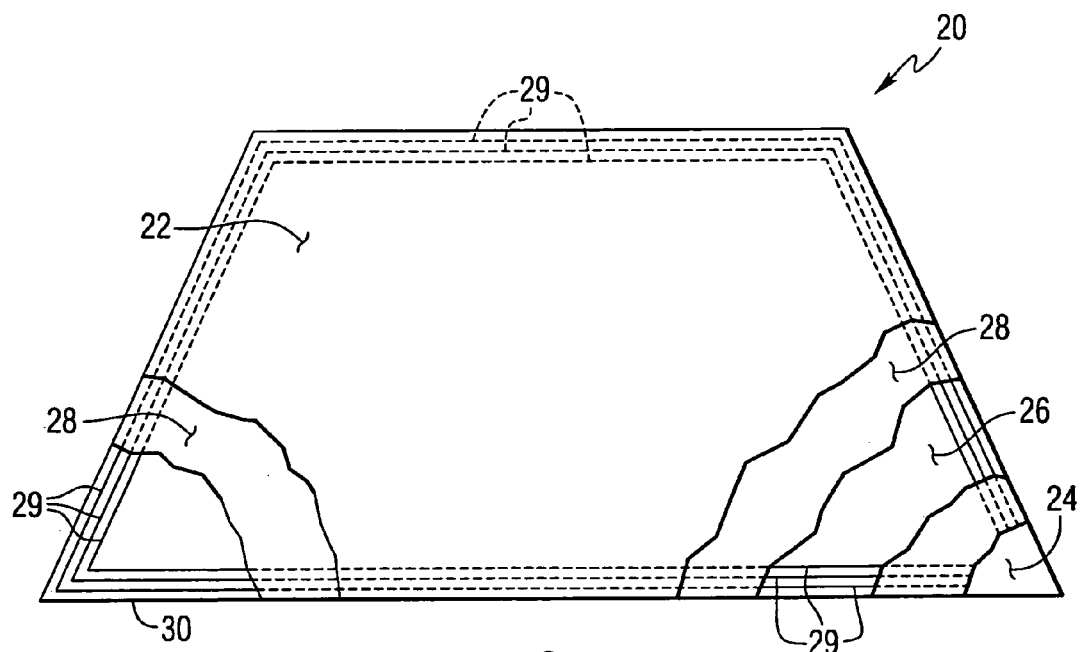
FIG. 1 is a front elevated view of an automotive windshield incorporating features of a non-limiting embodiment of the invention and having portions removed for purposes of clarity.

As used herein, spatial or directional terms, such as "inner", "outer", "left", "right", "up", "down", "horizontal", "vertical", and the like, relate to the invention as it is shown in FIGS. 1–8. However, it is to be understood that the invention can assume various alternative orientations and, accordingly, such terms are not to be considered as limiting. Further, all numbers expressing dimensions, physical characteristics, and so forth, used in the specification and claims are to be understood as being modified in all instances by the term "about". Accordingly, unless indicated to the contrary, the numerical values set forth in the following specification and claims can vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. Moreover, all ranges disclosed herein are to be understood to encompass any and all sub ranges subsumed therein. For example, a stated range of "1 to 10" should be considered to include any and all sub ranges between (and inclusive on the minimum value of 1 and the maximum value of 10; that is, all sub ranges beginning with a minimum value of 1 or more, e.g. 1 to 4.3, and ending with a maximum value of 10 or less, e.g., 5.5 to 10. Also, as used herein, the terms "deposited over", "applied over", or "provided over" mean deposited, applied, or provided on but not necessarily in surface contact with. For example, a material "deposited over" a substrate does not preclude the presence of one or more other materials of the same or different composition located between the deposited material and the substrate.

The terms "sealed layered edge of an article", "an article having sealed layered edge" and "sealed layered edge" as used herein mean an edge of an article having two or more substrates with at least the marginal edge portions of the substrates adhesively joined together with one or more adhesive layers. In one non-limiting embodiment of the invention, the sealed layered edge is the sealed layered edge of a laminate; the laminate having the major surface of a pair of substrates, e.g. glass sheets joined together by a plastic interlayer sheet. The major surface of the substrate includes the marginal edge portions of the substrate. In another non-limiting embodiment of the invention, the sealed layered edge is the sealed marginal edges of a multiple glazed unit that include the spacer frame, the marginal edges of the glass sheets and the adhesive layers between the marginal edges of the glass sheets and adjacent surfaces of the spacer frame.

The invention relates to preventing corrosion of a coating at the layered edge. In one non-limiting embodiment, the invention is practiced on an article having at least one substrate having a coating including at least one metal film. The corrosion of the metal film of the coating or the coating from the sealed layered edge of the article toward the interior of the article is impeded or stopped by providing discontinuities or areas of discontinuity in the metal film of the coating. The terms "discontinuity", "discontinuities", "area of discontinuity" or "areas of discontinuity" as used herein and relating to metal films means one or more impressions in metal film made by removing portions of the metal film to reduce the thickness of the metal film. The impressions may be partial removal of the metal film to reduce its thickness and/or one or more voids in, or holes through, the metal film. As will be appreciated and without limiting the invention, in one embodiment the "discontinuity", "discontinuities", "area of discontinuity" or "areas of discontinuity" be holes or voids in the metal film. In non-limiting embodiments of the invention where a depression or a groove extending along a path is the "discontinuity", "discontinuities", "area of discontinuity" or "areas of discontinuity", all or portions of the line or the groove can extend through the metal film.

The invention is not limited to the manner in which the metal film(s) is applied to a surface. More particularly and not limiting to the invention, the metal film can be applied as a sputtered coating, can be applied as a pyrolytic coating, can be painted on a surface, e.g. sprayed or brushed and/or can be applied as a film. All of the previously mentioned techniques for applying a metal film to a substrate are known in the art and no further discussion is deemed necessary.

In the following discussion, the coating is a sputtered coating of the type having one or more combinations of a metal film and a dielectric film. When the metal film reflects infrared energy, e.g. a silver or gold film, the coatings are usually referred to as solar control coatings; when the metal film is used to conduct electric current, e.g. stainless steel, silver or gold the coatings are usually referred to as heatable coatings. As can now be appreciated, a solar control coating can be used as a heatable coating and vice versa. In a non-limiting embodiment of the invention the metal film is a silver film. The sputtered coatings usually include one or more layers of a dielectric film over a silver film. When a sputtered coating is a dielectric film, e.g. an oxide of a metal over a silver film, the usual practice is to deposit a sacrificial film, e.g. a titanium film, over the silver film to prevent oxidation of the silver as the dielectric film is deposited. The sacrificial metal film usually is converted to an oxide of the metal, e.g. titanium oxide or dioxide. In the practice of the invention, although not limiting to the invention, discontinuities are provide in metal films that corrode by exposure of the edge of the article to the atmosphere. As can be appreciated by those skilled in the art, all or part of the sacrificial metal film is converted to a metal oxide during the deposition of the dielectric film over the sacrificial metal film, and usually all the sacrificial metal film is converted to a metal oxide when the coating is heated. Based on the forgoing but not limiting to the invention, it is preferred to provide a discontinuity in the sacrificial metal film that is over the silver film while applying the discontinuity to the silver film.

In the following discussion of non-limiting embodiments of the invention, discontinuities or areas of discontinuities are provided in a metal film that corrodes when the article having the metal film is exposed to the environment in which the article is usually used and/or tested for performance. As can be appreciated the invention is not limited thereto, and the invention can be practiced by applying discontinuities or areas of discontinuities in any type of coating that corrodes in the environment in which the article having the coating at the layered edge is used.

In the following discussion of the invention, the peripheral edges of the substrates and the plastic layers and/or sheets are aligned. As can be appreciated, the invention is not limited thereto and the sealed edge of the article can be spaced inward from one or more of the peripheral edges of selected ones or all of the substrates. In non-limiting embodiments of the invention, the discontinuities can be provided by removing portions of the coating extending from one surface, e.g. outer surface, of the coating to or through the metal film, e.g. the silver film farthermost from the outer surface, or through all the films of the coating, e.g. from the outer surface of the coating through the opposite surface of the coating.

In the following discussion, non-limiting embodiments of the invention are practiced on an automotive laminated windshield. However, as will be appreciated, the invention is not limited thereto and can be practiced on any laminated transparency, e.g. rear window, side window, roof window for any land, air, over the water, under the water and/or space vehicle, for residential and commercial buildings as well as storage cases, e.g. refrigerators having a viewing window.

With reference to FIG. 1, there is shown an automotive laminated windshield or laminate 20 incorporating features of the invention. The laminate 20 includes a pair of outer glass sheets 22 and 24, one of which has a coating 26 on a major surface, e.g. sheet 24 in FIG. 1. The coated surface of the sheet 24 and the major surface of the sheet 22 are laminated together by a plastic sheet 28 in any usual manner. The coating in the non-limiting article under discussion is a sputtered coating having at least one set of a metal film, e.g. an infrared reflecting film such as silver, and a dielectric film. However, as can be appreciated, the invention is not limited to a sputtered coating or the method of applying the sputtered coating to the glass surface. Sputtered coatings that can be used in the practice of the invention, but not limiting thereto, are electrically heatable coatings and/or solar control coatings of the type discussed in European Patent Application No. 00939609.4. Further as can be appreciated, the invention is not limited to glass sheets and/or the compositions of the glass sheets and any substrate, e.g. metal, wood, plastic, and/or any glass composition, can be used in the practice of the invention. For example, but not limiting to the invention, glass compositions of the type disclosed in U.S. Pat. Nos. 5,030,592; 5,240,886 and 5,593,929 can be used in the practice of the invention. Still further, the invention is not limited to the type of interlayer used to laminate the sheets together. For example but not limiting to the invention, the composite interlayer disclosed in U.S. patent application Ser. No. 10/201,863 filed on Jul. 24, 2002, in the names of Bruce A. Bartug, Allen R. Hawk, Robert N. Pinchok and James H. Schwartz for "Edge Sealing of a Laminated Transparency", and the interlayer disclosed in U.S. patent application Ser. No. 08/682,120 filed on Jun. 23, 1993, in the name of Glenn E. Freeman for "Windshield for Head-Up Display System" can be used in the practice of the invention, and each application is hereby incorporated by reference.

In the non-limiting embodiment of the invention shown in FIG. 1, the marginal edge portions of the coated sheet 24 have discontinuities provided by a plurality of endless break lines 29, e.g. circles, to impede corrosion of the metal film of the coating at the marginal edge portions of the sheet 24 from at least moving inward toward the interior of the laminate 20. The invention is not limited to the number of endless break lines in the coating at the marginal edge portions of the coated sheet 24. In the practice of the invention, at least one endless break line is used. In other non-limiting embodiments of the invention, two or three break lines are used. The spacing between the endless break lines and the distance from the peripheral edge 30 of the sheet 24 is not limiting to the invention. However, for aesthetic and for uninterrupted visibility, it is recommend that the endless break lines do not extend into the vision area of the transparency. The "vision area" is defined as the driver and passenger viewing area through the transparency with the automobile in motion. The spacing between the endless break lines is not limiting to the invention. However to accommodate a plurality of endless break lines outside the vision area of the transparency, in one non-limiting embodiment the endless break lines are spaced at least 2 mm apart, for example 3 mm apart.

The distance between the outermost endless line and the edge 30 of the sheet 24 is not limiting to the invention. However since extensive corrosion can result in delaminating or rupture of the sealed layered edge, in one non-limiting embodiment of the invention, the outermost endless break line is 3 mm from the edge 30 of the sheet 24. In another non-limiting embodiment the outermost break line is 2 mm from edge 30. The width of the endless break lines is not limiting to the invention. In one non-limiting embodiment of the invention, widths of the endless break lines are at least 0.5 mm, for example up to 0.75 mm. The depth of the endless break lines is not limiting to the invention, e.g. the endless break lines can have varying depths along their path, and the endless break lines can be of different depths. However to impede the corrosion of the metal film of the coating, portions of at least one of the endless break lines have a depth sufficient to extend through the metal film of a coating having only one metal film and portions of one break line have a depth sufficient to extend through all the metal films of a coating having two or more metal films. In one non-limiting embodiment of the invention all the break lines have a depth sufficient to extend though all the metal films of the coating.

FIGS. 2–6 show several non-limiting embodiments of the invention to provide discontinuities in the metal film of a coating at the marginal edge portions of the coated sheet.

Figure 2:
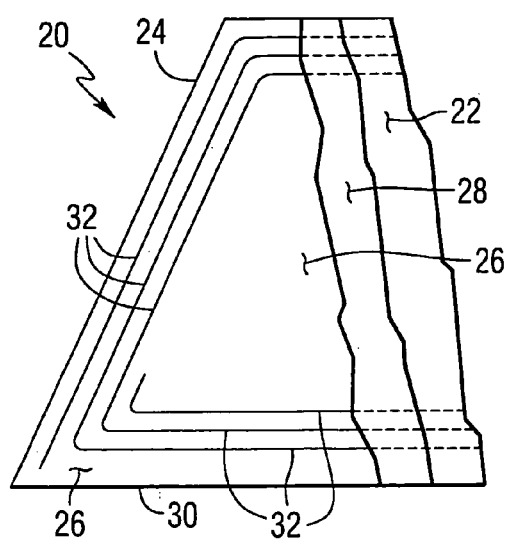
FIG. 2 is a fragmented front elevated view of a corner section of a laminated article, e.g. an automotive windshield of the type shown in FIG. 1, incorporating features of another non-limiting embodiment of the invention and having portions removed for purposes of clarity.

In FIG. 2, the discontinuities are provided in and/or through the metal film(s) of the coating 26 at the marginal edge portions of the sheet 24 (shown in FIG. 1) by a continuous helical break line 32. As can now be appreciated, the invention is not limited to the number of cycles of the helical break line in the coating. The terms "cycles of the helical break line" or the "break line cycle" are defined as a continuous break line from a starting point and making one complete turn around the marginal edge, spaced from the peripheral edge of the sheet and ending at a point aligned with the starting point and spaced farther in from the peripheral edge of the coated sheet than the starting point. The invention can be practiced having more than one break line cycle and less than two line cycles. In other non-limiting embodiments, the invention can be practiced using more than two break line cycles but less than three break line cycles, or more than three line cycles.

The spacing between adjacent portions of the break line 32 along its path and the distance from the edge 30 of the sheet 24 is not limiting to the invention. However, for aesthetic and for uninterrupted visibility, in one non-limiting embodiment portions of the break line 32 do not extend into the vision area of the transparency. The spacing between adjacent portions of the break line 32 is not limited to the invention. However, to accommodate a plurality of break line cycles outside the vision area of the transparency, in one non-limiting embodiment adjacent portions of the break line 32 are spaced 2 mm apart, for example 3 mm apart. The distance between the outermost break line cycle and the edge 30 of the sheet 24 is not limiting to the invention. However, extensive corrosion can result in delaminating or rupture of the sealed layered edge. As a result, in one non-limiting embodiment of the invention, the outermost break line cycle is spaced about 3 mm from the edge 30 of the sheet 24 and in another non-limiting embodiment, 2 mm from edge 30. The width of the break line 32 is not limiting to the invention. In one non-limiting embodiment, widths of at least 0.5 mm, for example up to 0.75 mm, can be used in the practice of the invention. The depth of the break line 32 is not limiting to the invention, and in one non-limiting embodiment the break line(s) can have varying depths along its path. To impede the corrosion of the metal film of the coating, portions of the break line have a depth sufficient to extend through the metal film of a coating having only one metal film and portions of break line have a depth sufficient to extend through all the metal films of a coating having two or more metal films. In one non-limiting embodiment, all of the break lines have a depth sufficient to extend though all the metal films of the coating.

Figure 3:
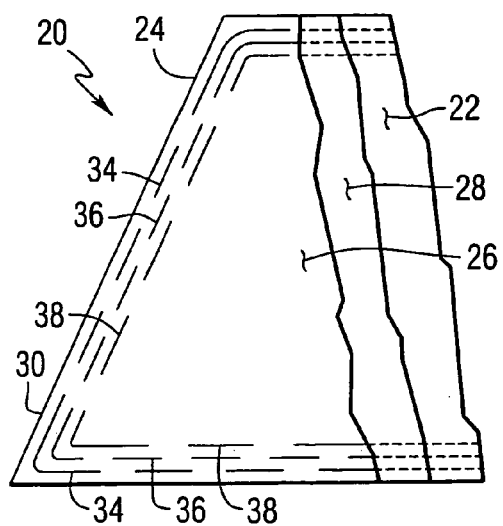
FIGS. 3–6 are views similar to the view of FIG. 2 illustrating additional non-limiting embodiments of the invention.

With reference to FIG. 3 there is shown another non-limiting embodiment of the invention. In FIG. 3 the coating surface 26 is provided with discontinuities in the form of two or more groups of a plurality of break line segments in the coating 26 at the marginal edge portions of the sheet 24 (shown in FIG. 1), e.g. Group I has break line segments 34, Group II has break line segments 36 and Group III has break line segments 38. The plurality of break line segments 34 of Group I have their ends spaced from one another and follow a path around and spaced from the peripheral edge 30 of the sheet 24. The plurality of break line segments 36 of Group II have their ends spaced from one another and follow a path around and spaced from the edge 30 of the sheet 24 a greater distance than the path of Group I. The plurality of break line segments 38 of Group III have their ends spaced from one another and follow a path around and spaced from the edge 30 of the sheet 24 spaced from the edge 30 of the sheet 24 a greater distance than the path of Group II.

The space between the ends of the break line segments 34, 36 and 38 are offset from one another such that the space between line segments of one group is spaced from a line segment of one or more of the others groups as shown in FIG. 3. As can now be appreciated, the invention is not limited to the number of groups of break line segments in the coating 26 at the marginal edge portion of the sheet 24. In the practice of the invention at least two groups are recommended to provide a break line segment of one group spaced from the break line segments of the other group, and in one non-limiting embodiment three groups of break line segments are used. Although not required, in one non-limiting embodiment of the invention, the groups of line segments are offset from one another such that along a line normal to any location on the peripheral edge 30 of the sheet 24 intersects at least a line segment from two groups as shown in FIG. 3.

The space between adjacent groups of break line segments and the distance from the edge 30 of the sheet 24 is not limiting to the invention. However, for aesthetic and for uninterrupted visibility it is recommend that the break line segments do not extend into the vision area of the transparency. The space between adjacent groups of line segments is not limited to the invention. However to accommodate a plurality of groups outside the vision area of the transparency, in one non-limiting embodiment, line segments of adjacent groups are spaced 3 mm apart. In another non-limiting embodiment, line segments of adjacent groups are 2 mm apart. The distance between the outermost group of line segments and the peripheral edge 30 of the sheet 24 is not limiting to the invention. However since extensive corrosion can result in delaminating or rupture of the sealed edge, in one non-limiting embodiment the outermost group of break line segments is spaced 3 mm from the peripheral edge 30 of the sheet 24. In another non-limiting embodiment, the outermost group is spaced 2 mm from edge 30. The space between break line segments of a group is not limiting to the invention. However to impede or stop the corrosion of the metal film, in various non-limiting embodiments, the space between break line segments of a group can be 12 mm, or 9 mm, or 6 mm. The width of the break line segments 34, 36 and 38 is not limited to the invention. In one non-limiting embodiment the line width is at least 0.5 mm, for example up to 0.75 mm.

The depth of the break line segments is not limiting to the invention, e.g. the break line segments can have varying depths along their path, and the break line segments can be of different depths. However to impede the corrosion of the metal film of the coating, portions of at least one group of the break line segments have a depth sufficient to extend through the metal film of a coating having only one metal film, and portions of one group of break line segments have a depth sufficient to extend through all the metal films of a coating having two or more metal films. In one non-limiting embodiment of the invention, all the break line segments have a depth sufficient to extend though all the metal films of the coating.

Figure 4:
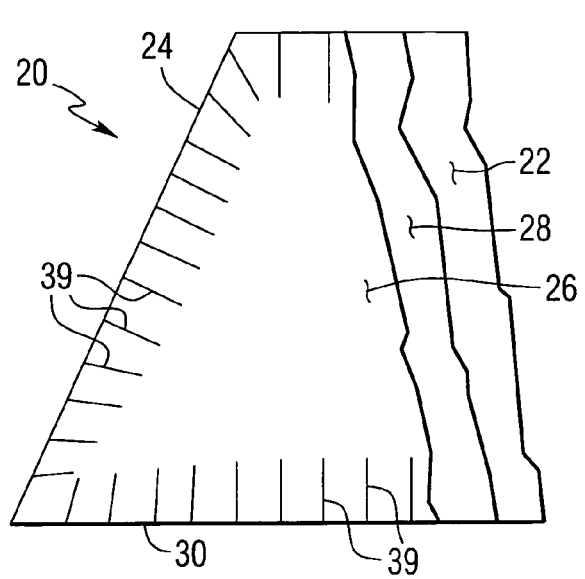

With reference to FIG. 4 there is shown still further another non-limiting embodiment of the invention. The coating thickness is provided by a plurality of break lines 39 in the coating 26 extending from the edge 30 of the sheet 26 (shown in FIG. 1) toward the interior of the sheet. Although the lines are shown as straight lines, the invention contemplates lines having any shape with the direction of the lines generally toward the interior of the coated sheet 26.

The space between adjacent break lines 39 and the distance lines 39 extend from the edge 30 of the sheet 24 is not limiting to the invention. However, for aesthetic and for uninterrupted visibility it is recommended that the break lines 39 do not extend into the vision area of the transparency. In one non-limiting embodiment of the invention, the break lines extend 6 mm, for example 8 mm, from the edge 30 of the sheet 24, and in another non-limiting embodiment the break lines extend 8 mm from the edge 30 of the sheet 24. The space between adjacent break lines 39 is not limited to the invention. However the smaller the spaced distance between break lines 39, e.g. more break lines 39, the more the corrosion of the metal film is impeded. Further the distance between adjacent break lines along the marginal edge of the coating 26 can be different for each set of adjacent break lines 39. In several non-limiting embodiments of the invention, the space between the break lines is 5 mm, or 3 mm, or 2 mm. The width of the break lines 39 is not limited to the invention, and in one non-limiting embodiment the width is at least 0.5 mm, for example up to 0.75 mm. The depth of the break lines 39 is not limiting to the invention, e.g. the break lines can have varying depth along their length and varying depths between break lines. However to impede the corrosion of the metal film of the coating, portions of at least every other break line should have a depth sufficient to extend through all the metal films of the coating. In one non-limiting embodiment all the break lines have a portion that extends through all the metal films and in another non-limiting embodiment, all the break lines have a depth sufficient to extend though all the metal films of the coating.

Figure 5:
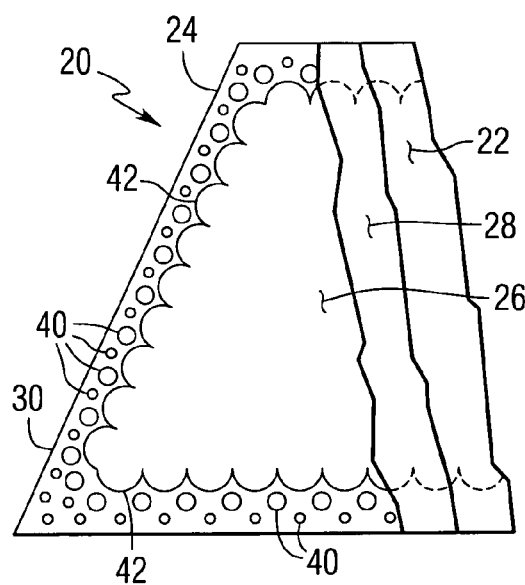

With reference to FIG. 5 there is shown another non-limiting embodiment of the invention. The marginal edges of the sheet 24 is provided with a plurality of shaped discrete coating areas, e.g. circles 40 having increasing diameter as the distance from the peripheral edge 30 of the sheet 24 increases. As can be appreciated, the invention is not limited to the diameter, area or number of discrete areas, or the shaped of the discrete areas. For aesthetics the edges of the continuous coating 26 has a scalloped edge 42 spaced from the edge 30 of the sheet 24. Further as can now be appreciated, the invention is not limited to the design pattern and any shape can be used, e.g. instead of circles, rectangles half moons, etc. may be used. Further, names or sayings can be provided on the marginal edges which function to provide aesthetics and prevent corrosion. As can be appreciated, the spaced distance between the areas 40 can be portions of the coating that are void of the metal film. In this manner, only those portions of the coating having the metal film need to be remove or masked to provide the discrete areas having metal films. As can be appreciated, removing all metal films in the coating from between the discrete areas can impede and even stop the corrosion of the metal film at least inward from the edge 30 of the sheet 24.

Figure 6:
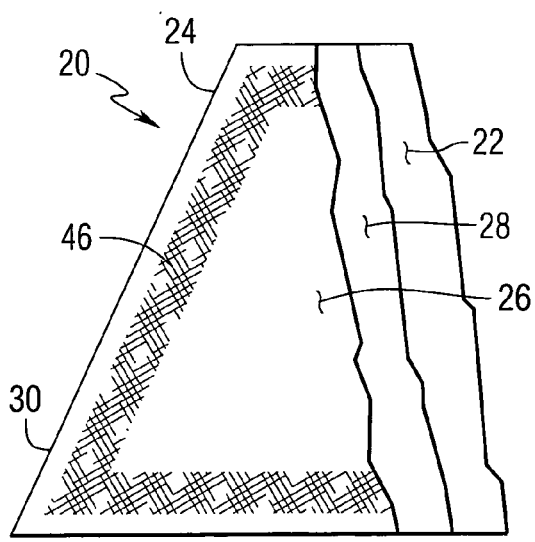

With reference to FIG. 6, there is shown yet another non-limiting embodiment of the invention. In FIG. 6, voids in the metal film are provided by abraded surface 46 of the coating 26 at the marginal edges of the coated sheet 24. The abraded surface has voids of random depth in the coating; in particular, some or all of the voids extend through all the metal films of the coating.

The abraded surface 46 can be made using any type of article having an abrasive surface, and any equipment or technique to abrade the coating. Although not limiting to the invention, the coating can be abraded using steel wool, plastic fibers, sand paper, and/or plastic scouring pads, e.g. of the type sold by 3M Home Products Division under the mark Scotch Brite. Although not required, in one non-limiting embodiment, completely removing the coating is avoided thereby eliminating any possible damage to the surface of the glass sheet. The width of the abraded surface as measured from the edge 30 of the coated sheet 24 is not limiting to the invention. However, in one non-limiting embodiment the width is at least 3 mm, for example 6 mm or 8 mm. The invention is not limited to the pressure applied to the abrasive article as it is moved across the coating 26 at the marginal edge of the sheet 24 (shown in FIG. 1). However, the pressure should be sufficient to remove sufficient thickness of the coating to randomly provide areas of discontinuity. One pass with an abrasive article with medium applied pressure is sufficient to remove a coating depth that provides spaced voids in the metal film. However, the invention contemplates more than one pass with medium pressure applied to the abrasive article. As can be appreciated the amount of material removed is a function of the roughness of the abrasive surface, the pressure applied to the abrasive article, the number of passes and the hardness of the coating. As the roughness of the abrasive surface increases while keeping the other parameters constant, the thickness of coating removed increases and vice versa; as the pressure applied to the abrasive article increases while keeping the other parameters constant, the thickness of coating removed increases and vice versa; as the number of passes across the surface with the abrasive article increases while keeping the other parameters constant, the thickness of coating removed increases and vice versa; and as the hardness of the coating increases while keeping the other parameters constant, the thickness of coating removed decreases and vice versa.

The areas of discontinuity in the coating 26 in the form of the endless break lines 29 of FIG. 1; the break line 32 of FIG. 2; the break line segments 34, 36 and 38 of FIG. 3; the break lines 39 of FIG. 4, the pattern of discrete areas 40, the scalloped edge 42, and words in the embodiment of the invention, of FIG. 5, can be made in the coating 26 in any usual manner, e.g. using abrasive paper, laser or stylus or in the alternative can be provided using any usual coating deletion technique during the coating process, e.g. a mask or applying a water soluble film, a tape and/or a thread on the surface of the glass and removing the soluble film, tape and thread and any coating thereon after the coating is applied to the surface of the sheet. Further the deletion techniques can be used to delete all the films of the coating or to delete only the metal films of the coating.

Figure 8:
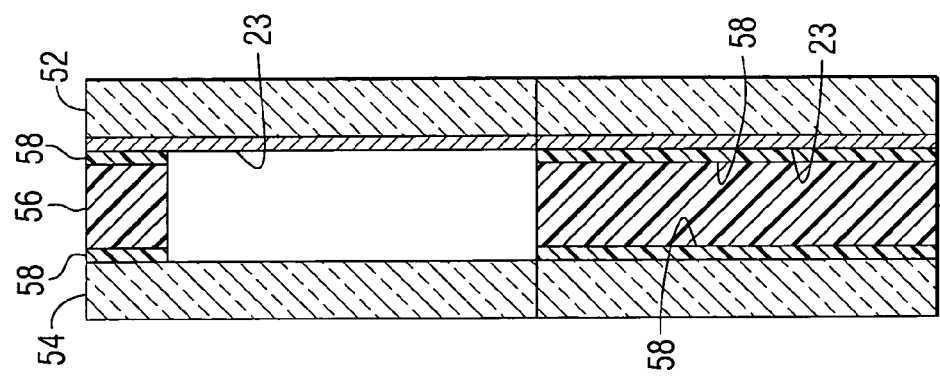
FIG. 8 is a sectional view taken along line 8—8 of FIG. 7.
Figure 7:
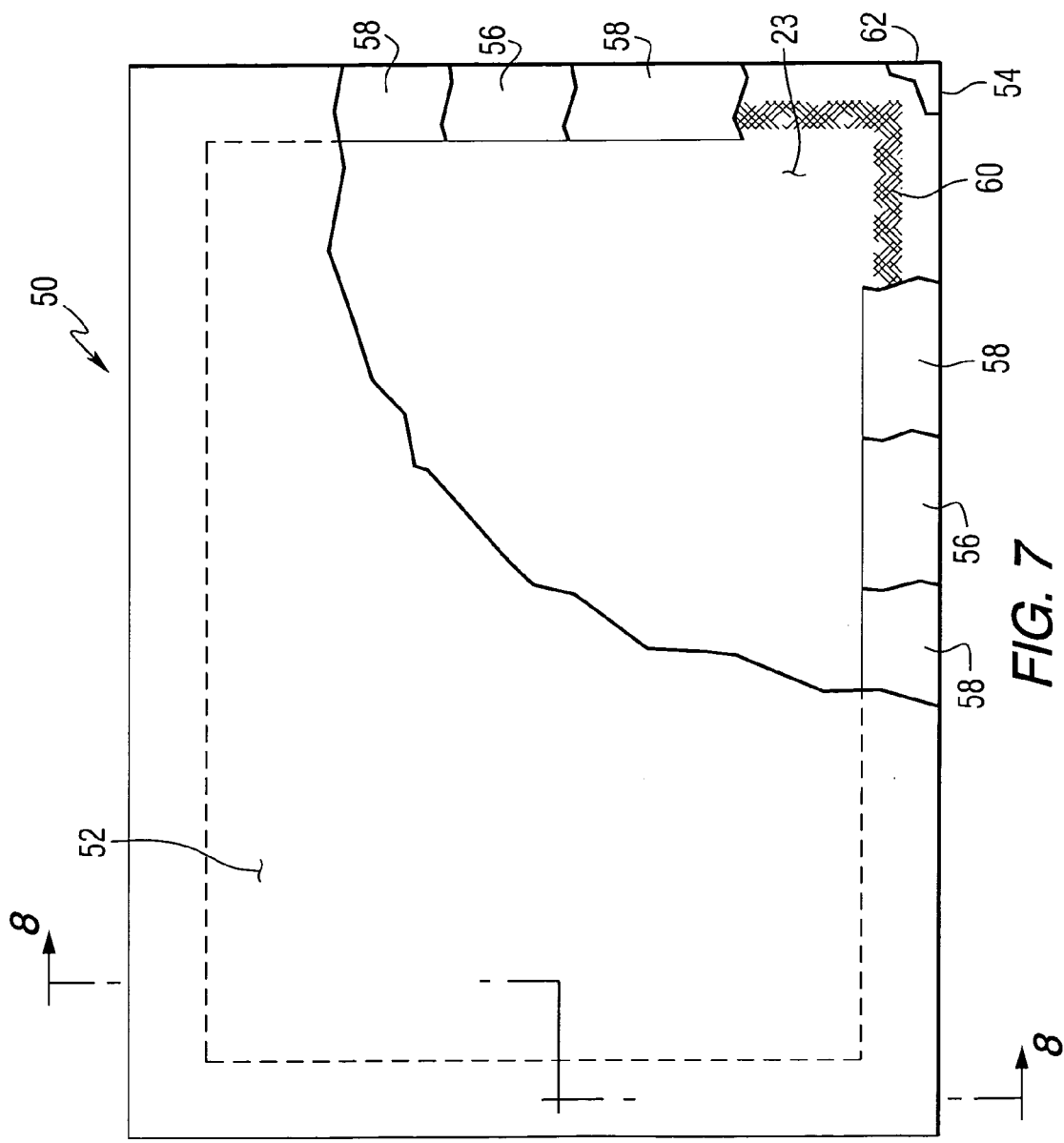
FIG. 7 is an elevated front view of a multiple glazed unit incorporating features of the invention and having portions removed for purposes of clarity.

With reference to FIGS. 7 and 8 there is shown a multiple glazed unit 50. The unit 50 includes a pair of glass sheets 52 and 54 adhered to a spacer frame 56 by a layers 58 of moisture impervious adhesive applied to opposite sides of the spacer frame 56. The spacer frame usually contains a desiccant (not shown) to remove moisture trapped in the space between the sheets during fabrication of the unit. A coating 23 is applied to a major surface of the sheet 54. The method of fabricating the unit 50 and the design of the components of the unit 50 are not limiting to the invention and any method of fabricating a glazed unit, any type of a glazed unit and/or design of a multiple glazed unit can be used in the practice of the invention, e.g. as taught in U.S. Pat. Nos. 5,761,946 and 5,775,393, which patents are hereby incorporated by reference.

With continued reference to FIG. 7, a coating thickness pattern of the type shown in FIG. 6, i.e. the abraded surface 60, is made on the outer marginal edges of the coating 23. As can now be appreciated, any of the embodiments of the discontinuities discussed above to impede corrosion of the metal film(s) of the coating at least toward the interior of the metal film and/or shown in FIGS. 1–6 can be used to impede corrosion of the metal film at the marginal edges 62 of the coated sheet 54 of the unit shown in FIGS. 7 and 8 from at least moving toward the interior of the unit.

The following discussion is directed to experiments conducted to determine the effectiveness of discontinuities in the metal film of a coating to impede corrosion of the metal film at the layered edge of an article at least away from the edge of the article toward the interior of the article.

The E Chip software sold by E Chip, Inc. was used to design a screening experiment for the following variables:

1. (a) seaming the edges of coated glass pieces with 180 grit sandpaper, or (b) leaving the edges of the coated glass pieces as cut;
2. all the glass pieces of 1 (a) and 1 (b) had (a) discontinuities made in the metal film of the coating before heating the coated glass piece, by wiping the marginal edge portions of the coating with 80 grit sandpaper within a distance of 10 mm from the edge of the glass piece; or (b) no discontinuities made in the metal film of the coating before heating the coated glass piece;
3. all the glass pieces of 2 (a) and 2 (b) were heated to one of the following temperatures: (a) a temperature of 1000° F. (538° C.), (b) a temperature of 1100° F. (593° C.), or (c) a temperature of 1200° F. (649° C.);
4. all the glass pieces of 3 (a), (b) and (c) had (a) discontinuities made in the metal film of the coating by submerging each corner of the glass piece in a container of material used for sandblasting up to a depth of 6 inches (15.24 centimeters ("cm")), or (b) not applying discontinuities in the metal film of the coating;
5. all the coated glass pieces of 4 (a) and (b) were assembled with an uncoated piece of glass prior to lamination with a polyvinyl butyral ("PVB") interlayer sheet (a) of the type sold by Solutia Company under the mark RB or (b) of the type sold by Solutia Company under the mark RC; RB has a higher adhesion than RC; and
6. all the assembled pieces of 5 (a) and (b) had the PVB at (a) the edge of the glass pieces, or (b) 3 mm in from the edges of the glass pieces.

The coating applied to the glass pieces was a heatable solar control coating of the type disclosed in European Patent Application No. 00939609.4. Unless indicated otherwise, all samples discussed herein had a coating that included from the surface of the glass piece: a zinc stannate dielectric film, a silver film, a titanium sacrificial film, a zinc stannate dielectric film, a silver film, a titanium sacrificial film, a zinc stannate dielectric film and an outer protective film of titanium dioxide. The assembled glass pieces were laminated wherein the assembled glass pieces were heated to a temperature of 285° F. (135° C.) at a pressure of 210 pounds per square inch (psi) (14.75 kilograms per square centimeter ("ksc")) for about 71 minutes during the autoclave cycle. One group of samples was subjected to a salt bath test, and a second group identical to the first group was subjected to a fog test. The salt-water test was performed by placing the samples in a bath of 5% sodium chloride in water having a pH of 4 and heated to a temperature of 130° F. (54.45° C.) for a period of 300 hours. The fog test as performed by placing the samples in a chamber and exposing the samples to the following procedure:

Step 1. Salt Fog at 40° C. for 20 minutes.
Step 2. Discontinue salt Fog and expose samples to 100% RH (relative humidity) at 40° C. for 3 hours and 40 minutes.
Step 3. Heating the samples to a temperature of 40° C. for a period of 4 hours to dry the samples.
Step 4. Expose samples to 100% RH at 40° C. for 4 hours.
Step 5. Heating the samples to a temperature of 40° C. for a period of 4 hours to dry the samples
Step 6. Expose samples to 100% RH at 40° C. for 4 hours.
Step 7. Heating the samples to a temperature of 40° C. for a period of 4 hours to dry the samples.

Steps 1 thru 7 were repeated 60 times. The salt fog was a solution of 1% plus or minus 0.025% sodium chloride adjusted to a pH of 4 using sulfuric acid.

After the tests were completed, the samples were washed, dried and visually inspected with the unaided eye and the depth of degradation or corrosion from the edge of the sample, and the area of the degradation or corrosion, of the metal film of the coating were measured. The measurements of the corrosion of the samples were analyzed using the E Chip software and the results were:

1. Seaming the edges of the coated glass pieces was slightly beneficial over no seaming;
2. Applying discontinuities in the metal films before heating was extremely effective in reducing corrosion;
3. Higher temperatures were slightly beneficial in reducing corrosion over lower temperatures;
4. Applying discontinuities in the metal films after heating did not impede corrosion; to the contrary they slightly enhanced corrosion;
5. Different level of vinyl adhesion had no significant effect to impede corrosion, and
6. The PVB in from the edge of the glass pieces was extremely detrimental; it enhanced corrosion.

The results of the salt fog test indicated that the PVB in from the edge had the most corrosion, whereas the salt bath test indicated that the PVB in from the edge was a non-significant contributor to corrosion. It is believed that the samples having the PVB in from the edge did not have an acceptable performance during the salt fog test but had an acceptable performance during the salt bath test because the salt bath is an immersion test and therefore the PVB in from the edge would not show up as a defect. In the salt fog test the areas of PVB from the edge act as a reservoir to hold the salt and the cyclic drying and rewetting during the test accelerates the corrosion rate.

The next experiment was to use different techniques to provide discontinuities in the metal film to determine what affect, if any, the discontinuities in the metal film have on the amount and rate of corrosion. The coating at the marginal edges of three (3) coated glass samples was abraded using 60 grit sandpaper; the coating at the marginal edges of three (3) coated glass samples were abraded using 500 grit sandpaper; the coating at the marginal edges of three (3) coated glass samples were abraded using a plastic scrubbing pad of they type sold by 3M Home products Division of 3M under the mark Scotch Brite, and the coating at the marginal edges of three (3) coated glass samples were abraded using a wire mesh, to impose discontinuities in the metal films. Four (4) glass samples had an interruption line in the coating provided by a fine thread laid on the glass pieces prior to depositing the coating on the glass; the surface of the thread was wiped with glue to secure the thread on the glass surface during coating. After the glass pieces were coated the thread was remove. The coated samples were not heated prior to laminating. After the samples were laminated as discussed above, they were exposed to the salt bath test described above for three hundred hours.

After the salt bath test, the samples were washed, dried and visually observed with the unaided eye. Corrosion of the coating was noted beyond the abraded area for all samples having the abraded coating, i.e. discontinuities in the metal film. Three of the four samples having the thread on the glass during coating showed the corrosion stopping at the break line. The fourth sample, at one point, had corrosion crossing the break line. It is suspected that the thread at that point was not on the glass and there was coating under the thread bridging the break line. The samples were returned to the salt bath for an additional 600 hours, after which the samples were removed, washed and dried, and the coating at the marginal edges of the samples visually inspected with the unaided eye. The corrosion of the coating of the samples having the coating abraded extended further away from the edge of the samples. The corrosion of the coating for the samples having the break line did not cross over the break line. The point of corrosion that crossed over the break line noted above did not significantly advance during the additional 600-hour salt bath test.

Windshields were made on a production line using the commercial process of cutting blanks from glass sheets, seaming the edges of the blanks, coating one of the glass sheets, bending the glass sheets and laminating the sheets together. The process for fabricating windshields is well known in the art and no further discussion is deemed necessary. Prior to coating the blanks, tapes having a width of ¼ inch and ½ inch were applied to the glass blanks about 4 millimeters ("mm") in from the edge. The tapes were removed after coating to provide a break line in the coating. After the windshields were fabricated, they were placed in a salt bath of the type previously discussed for a period of 600 hours. The windshields were removed washed, dried and visually observed with the unaided eye. Corrosion was noted at the marginal edge of the coating, however no corrosion crossed over the break line.

Thirteen windshields were made for a two years outdoor exposure test in Jacksonville, Fla. The windshields were made on a production line using the commercial process practiced at that time with the noted changes. Two coated blanks were abraded for a distance of 5 to 6 mm in from the edge prior to heating the coated blanks to impose discontinues in the metal film of the coating. Eight coated blanks had coating deleted using tape over the glass blank during the coating process; two coated blanks had coating deleted 6 mm from the edge of the coated blank; two coated blanks had coating deleted 4 mm from the edge of the coated blank;

two coated blanks had a 2 mm wide break line 4 mm from the edge of the coated blank; one coated blank had a 2 mm wide break line 4 mm from the edge of the coated blank, and one coated blank had a 4 mm break line 5 to 6 mm from the edge of the coated blank. One coated blank had a break line the width of a thread 6 to 8 mm in from the edge of the coated blank; one coated blank had a three inch wide black ceramic band at the edge of the blank and the coating applied to the blank extended over the black band, and one sample was made in the usual manner, had no discontinuities imposed in the metal film of the coating and was the control sample.

After two years, the windshields were visually observed with the unaided eye. No corrosion was noted for the samples that had the coating deleted. Corrosion was observed at the marginal edge of the samples having the break lines with no corrosion crossing over the break lines. Corrosion was not noted beyond the abraded area for the sample having the coating abraded with the plastic scouring pad. No corrosion was noted at the marginal edge of the sample having the black band. Because the band would hide any corrosion that may be present at the marginal edge of the coated sheet, no conclusion could be reached regarding the absence or presence of corrosion at the marginal edge. No corrosion was noted inwardly from the band. The control sample had corrosion at the marginal edges extending up to 2 mm in from the edge, and on one side of the windshield for a distance of 9 mm from the edge had tiny silver colored dots were noted. It is believed that the presence of silver dots is a change in the coating that indicates that the corrosion of the silver film has started.

Based on the results of the above experiments, it was concluded that the discontinuities, e.g. the voids in and/or through the metal film(s) impede the corrosion of the metal layer by acting as a break line to at least prevent the continued corrosion of the metal film inward away from the edge. More particularly, when the coating or metal film is heated, e.g. during shaping, heat strengthening or thermal tempering the coated sheet, the surface tension of the silver in the fluid state causes the silver to bead up, increasing the area of the voids in and through the silver film. In the instances where the voids are made in and/or through the metal film after the coated sheet is heated or if the voids are made in and/or through the metal film and the sheet is not heated, it is recommended, although not required, that the embodiments of FIGS. 1–3 and 5 be practiced to impede corrosion of the metal film at least away from the edge of the coated sheet. In the instance when the voids are made in and/or through the metal film before the coated sheet is heated, the embodiments of FIGS. 1–6 can be practiced to impede corrosion of the metal film at least away from the edge of the coated sheet.

Although not required in the practice of the present invention, the voids in and/or through the silver film can be applied during the application of the coating to the sheet and/or any time after the sheet is coated. In addition and although not required in the practice of the present invention, the discontinuities or areas of discontinuities are applied to the coated sheet before the coated sheet is subjected to thermal processing, e.g. shaping the coated sheet, annealing the coated sheet or forming the laminate or multiple glazed unit. The invention is not limited to the temperature range at which the coated sheet is heated; however, as can be appreciated the temperature at the low side of the temperature range should be sufficient to carry out the thermal process and the high side of the temperature range should not exceed a temperature that would thermally damage the sheet or the coating. In one non-limiting embodiment of the invention the temperature range is 600 to 1300° F. (316 to 705° C.). It has been determined that the area of the void in the silver film increases at temperatures above 600° F. (316° C.). More particularly, at temperatures above 600° F. (316° C.), the silver pulls away from the void in or through the silver film due to surface tension of the silver; as the area of the void increase, the dielectric film fills the void to cover and seal the silver bead. As can now be appreciated as the flat silver film forms beads the length of the silver film is reduced. With the silver beads covered by the dielectric film or the area of the void increased, there is no silver to continue the corrosion and the corrosion of the silver at the sealed layered edge is impeded or stopped from moving at least inward from the edge of the coated sheet or blank.

Based on the above discussion, it can now be appreciated that the rate and degree of corrosion growth is expected to be higher if the area of discontinuity is applied to a coating after all the thermal processing is completed. However, the rate and degree of corrosion growth and/or spread will be less if discontinuities are made in a silver film prior to heating of the film.

As can be appreciated, the invention contemplates providing break lines only in the metal film of a multifilm coating. For example but not limiting to the invention, a tape or thread can be used only when the metal film is to be deposited. In this manner only the metal film of the coating will have the break line or lines, the dielectric film and sacrificial films will be continuous.

The invention contemplates applying a coating to one or both the outer major surfaces of the article having the sealed edges. For example but not limiting to the invention, the outer surface of the article can include a self cleaning coating, e.g. of the type disclosed in U.S. Pat. No. 6,027,766 and/or sold by PPG Industries, Inc. under their trademark SUNCLEAN and/or a hydrophobic coating of the type disclosed in U.S. Pat. No. 5,523,162 and/or sold by PPG Industries Inc. under the trademark AQUAPEL or SURFACE SEAL, which patents are herby incorporated by reference. The coatings can be applied to opposed surfaces of a glass sheet, e.g. the outer surface of on e of the sheets and the inner surface of the other sheet.

As can be appreciated the invention is not limited to the above examples, which were present for illustration purposes only, and any coating thickness pattern that goes through the silver can be used in the practice of the invention. The particular embodiments described in detail herein are illustrative only and are not limiting to the scope of the invention, which is to be given the full breadth of the appended claims and any and all equivalents thereof.

What is claimed is:

1. An article having a sealed edge comprising:
   a first substrate having a major surface;
   a second substrate having a major surface wherein at least one of the first and second substrates is a transparent substrate;
   a transparent coating sputter deposited on center portion of the maior surface of the first substrate with the coating extending to at least marginal edges of the major surface of the first substrate, the coating including at least one metal film between a pair of dielectric films wherein the metal film at the marginal edges of the maior surface of the first substrate has at least one area of discontinuity and a portion of at least one of the dielectric films has continuity from the marginal edges to the center portion of the first substrate, and an edge assembly securing the first substrate in a fixed relationship to the second substrate with the major surfaces of the substrates facing one another to provide an article having a sealed edge.

2. The article according to claim 1, wherein the first and second substrates are glass sheets.

3. The article according to claim 2, wherein the at least one area of discontinuity comprises a plurality of spaced discrete coating areas on the marginal edges of the first sheet.

4. The article according to claim 3, wherein the article is a laminated transparency and the edge assembly comprises a plastic interlayer sheet between and securing the sheets in a fixed relationship to one another.

5. The article according to claim 3, wherein the article is a multiple glazed unit and the edge assembly is a spacer frame having a desiccant and a moisture impervious layer on opposed surfaces of the spacer frame, the spacer frame between and the moisture impervious layers adhered to adjacent ones of the glass sheets.

6. The article according to claim 5, wherein area of the discrete coating areas increases as the distance from a peripheral edge of the first sheet increases.

7. The article according to claim 6, wherein at least a portion of the at least one area of discontinuity is within 8 mm from the peripheral edge of the first sheet.

8. The article according to claim 7, wherein the at least one area of discontinuity comprises the coating at the marginal edges of the first sheet having peaks and valleys, with an outermost film of the coating removed and portions of the metal film of the coating removed.

9. The article according to claim 2, wherein the article has at least one outer surface having a hydrophobic film.

10. The article according to claim 3, wherein the discrete coating areas have an area that increases as the distance from a peripheral edge of the first sheet increases.

11. The article according to claim 10, wherein at least a portion of the at least one area of discontinuity is within a distance of 8 mm spaced from the peripheral edge of the first sheet.

12. The article according to claim 11, wherein at least a portion of the at least one area of discontinuity is within a distance of 3 mm spaced from the peripheral edge of the first sheet.

13. The article according to claim 12, wherein the at least one area of discontinuity comprises the coating at the marginal edges of the first sheet having peaks and valleys, with an outermost film of the coating removed and portions of an innermost film of the coating removed.

14. The article according to claim 13 wherein at least one outer surface of the article has a photocatalytic coating.

15. An article having a sealed edge comprising:
a first glass sheet having a major surface;
a second glass sheet having a major surface;
a sputtered coating deposited over the major surface of the first glass sheet, the coating including at least one metal film and a dielectric film, the at least one metal film having at least one area of discontinuity, wherein the at least one area of discontinuity includes at least one groove in at least the metal film of the coating, the groove extending along a path spaced from the edge of the first sheet with portions of the at least one groove extending through at least portions of the at least one metal film, and
an edge assembly securing the first glass sheet in a fixed relationship to the second glass sheet with the major surfaces of the sheets facing one another to provide an article having a sealed edge.

16. The article according to claim 15, wherein the at least one groove has endless length.

17. The article according to claim 16, wherein the at least one groove is a first groove, the coating includes two combinations of a metal film and a dielectric film and the metal films are silver films, and further including second and third grooves each of endless length defined as a second endless groove and third endless groove, respectively, wherein the second endless groove is within the first endless groove and the third endless groove is within the second endless groove and each of the endless grooves have portions that extend through both the silver films.

18. The article according to claim 17, wherein the first, second, and third endless grooves are in the coating at the marginal edge portion of the first sheet and within 8 mm of a peripheral edge of the first sheet.

19. The article according to claim 16, wherein the article is a laminated transparency and the edge assembly comprises a plastic interlayer sheet between and securing the sheets in a fixed relationship to one another.

20. The article according to claim 16, wherein the article is a multiple glazed unit and the edge assembly is a spacer frame having a desiccant and a moisture impervious layer on opposed surfaces of the spacer frame, the spacer frame between and the moisture impervious layers adhered to adjacent ones of the glass sheets.

21. The article according to claim 15, wherein the at least one groove is a plurality of spaced grooves have a starting point adjacent a peripheral edge of the first sheet and extending inward from the peripheral edge.

22. The article according to claim 21, wherein the plurality of spaced grooves end within a distance of 8 mm spaced from the peripheral edge of the first sheet.

23. The article according to claim 15, wherein the at least one groove is a continuous groove having a starting point in the coating at the marginal edge of the first sheet and extending away from the starting point along a path spaced from and generally following a peripheral edge of the first sheet and ending a cycle defined as the first cycle at an end point aligned with the starting point of the first cycle and spaced a greater distance from the peripheral edge of the first sheet than the distance of the starting point of the first cycle from the peripheral edge of the first sheet, wherein portions of the continuous groove along path of the first cycle extend through at least a portion of the at least one metal film.

24. The article according to claim 23, wherein the continuous groove further comprises at least one additional cycle starting at the end point of the first cycle and extending continuously from the end point of the first cycle along a path away from the end point of the first cycle, spaced from the continuous groove of the first cycle and generally following the peripheral edge of the first sheet and ending at an end point aligned with the starting point of the at least one additional cycle and spaced a greater distance from the peripheral edge of the first sheet than the distance of the starting point of the at least one additional cycle from the peripheral edge of the first sheet, wherein portions of the at least one groove along path of the first cycle and at least one additional cycle extend through at least a portion of the at least one metal film.

25. The article according to claim 24, wherein the coating has two combinations of a metal film and a dielectric film and each metal film is a silver film, and the continuous groove is within 8 mm of the peripheral edge of the first sheet and portions of the continuous groove extend through the first and second silver films.

26. The article according to claim 25, wherein the article is a laminated transparency and the edge assembly comprises a plastic interlayer sheet between and securing the sheets in a fixed relationship to one another.

27. The article according to claim 25, wherein the article is a multiple glazed unit and the edge assembly is a spacer frame having a desiccant and a moisture impervious layer on opposed surfaces of the spacer frame, the spacer frame between and the moisture impervious layers adhered to adjacent ones of the glass sheets.

28. The article according to claim 15, wherein the at least one groove comprises a first plurality of discrete groove segments in the at least one metal film along a path spaced from a peripheral edge of the first sheet defined as a first path with a space between ends of adjacent first groove segments, and a second plurality of discrete groove segments in the at least one metal film along a second path, the second path spaced from the first path a greater distance from the peripheral edge of the first sheet than the first path with a space between ends of adjacent second groove segments, and wherein the first groove segments are generally aligned with the space between the ends of the adjacent second groove segments and selected portions of the first and second groove segments along the first and second paths, respectively, extend through the metal film.

29. The article according to claim 28, wherein the article is a laminated transparency and the edge assembly comprises a plastic interlayer sheet between and securing the sheets in a fixed relationship to one another.

30. The article according to claim 28, wherein the article is a multiple glazed unit and the edge assembly is a spacer frame having a desiccant and a moisture impervious layer on opposed surfaces of the spacer frame, the spacer frame between and the moisture impervious layers adhered to adjacent ones of the glass sheets.

31. An article having a sealed edge comprising:

a first substrate having a major surface;

a second substrate having a major surface wherein at least one of the substrates is a transparent substrate; and a transparent coating deposited on and covering center portions and marginal edge portions of the major surface of the first substrate, the coating including at least one metal film between a pair of dielectric films, the metal film having discontinuities at the marginal edge portions and a portion of at least one of the dielectric films has continuity from the marginal edges to the center portion of the first substrate, wherein at least the coating is secured to marginal edge portions of the second substrate to provide an article having a sealed layered edge.

32. The article according to claim 31 wherein the coating is a sputtered coating.

* * * * *